United States Patent
Kaufmann et al.

(10) Patent No.: US 12,484,150 B2
(45) Date of Patent: Nov. 25, 2025

(54) SYSTEMS AND ASSEMBLIES ASSOCIATED WITH A FLEXIBLE PRINTED CIRCUIT BOARD WITH COILS PRINTED THEREON FOR INDICATING POSITION OF A MOVABLE MEMBER

(71) Applicant: Sun Hydraulics, LLC, Sarasota, FL (US)

(72) Inventors: Jonathan Kaufmann, Sarasota, FL (US); Benjamin Kaufmann, Sarasota, FL (US); Alexander Flores, Sarasota, FL (US); Allison Shaw, Sarasota, FL (US)

(73) Assignee: Sun Hydraulics, LLC, Sarasota, FL (US)

( * ) Notice: Subject to any disclaimer, the term of this patent is extended or adjusted under 35 U.S.C. 154(b) by 189 days.

(21) Appl. No.: 18/430,966

(22) Filed: Feb. 2, 2024

(65) Prior Publication Data

US 2024/0268026 A1     Aug. 8, 2024

Related U.S. Application Data

(60) Provisional application No. 63/483,795, filed on Feb. 8, 2023.

(51) Int. Cl.
*H05K 1/11* (2006.01)
*G01D 5/20* (2006.01)
(Continued)

(52) U.S. Cl.
CPC ........... *H05K 1/118* (2013.01); *G01D 5/2053* (2013.01); *H05K 1/028* (2013.01); *H05K 1/165* (2013.01)

(58) Field of Classification Search
CPC ........ H05K 1/118; H05K 1/028; H05K 1/165; G01D 5/2053
(Continued)

(56) References Cited

U.S. PATENT DOCUMENTS

| 2009/0001305 A1 | 1/2009 | Cook et al. |
| 2015/0000663 A1 | 1/2015 | Williams et al. |
| 2021/0012938 A1* | 1/2021 | Dams .................... H01F 7/1615 |

FOREIGN PATENT DOCUMENTS

| CN | 105 333 982 A | 2/2016 |
| JP | 2008 309309 A | 12/2008 |

OTHER PUBLICATIONS

International Search Report and Written Opinion prepared by the European Patent Office in International Application No. PCT/US2024/014170 dated May 10, 2024.

* cited by examiner

*Primary Examiner* — Binh B Tran
(74) *Attorney, Agent, or Firm* — McDonnell Boehnen Hulbert & Berghoff LLP

(57) ABSTRACT

An example assembly includes: a housing; a movable member configured to move within the housing; and a coil flexible printed circuit board (FPCB) wrapped around the housing, wherein the coil FPCB comprises: at least one excitation coil printed on the coil FPCB as a conductive track, wherein the excitation coil is configured to generate a magnetic field when an electric current is provided through the conductive track, and at least one sensing coil printed on the coil FPCB as a respective conductive track, wherein the magnetic field generated by the excitation coil is configured to induce a respective electric current in the at least one sensing coil, and wherein movement of the movable mem-
(Continued)

ber within the housing changes a parameter associated with the respective electric current, thereby indicating a position of the movable member.

20 Claims, 9 Drawing Sheets

(51) Int. Cl.
*H05K 1/02* (2006.01)
*H05K 1/16* (2006.01)

(58) Field of Classification Search
USPC .......................................................... 361/749
See application file for complete search history.

SYSTEMS AND ASSEMBLIES ASSOCIATED WITH A FLEXIBLE PRINTED CIRCUIT BOARD WITH COILS PRINTED THEREON FOR INDICATING POSITION OF A MOVABLE MEMBER

CROSS REFERENCE TO RELATED APPLICATION

This application claims priority to U.S. Provisional Patent Application No. 63/483,795, filed on Feb. 8, 2023, the entire contents of which are herein incorporated by reference as if fully set forth in this description.

BACKGROUND

Many applications involve movable members such as pistons, spools, poppets, rotors, etc. Control of such movable members typically involves having a sensor that detects position (linear and/or rotary) of the movable member and provides sensor information indicative of such position to a controller.

The controller can, for example, control movement of the movable member based on the sensor information, e.g., by implementing a feedback control loop. In an example, the controller may infer another parameter, such as flow through a valve, based on the position of the movable member. In another example, the controller may determine based on the sensor information that the movable member is in a safe position. As such, having a sensor that provides accurate position information is critical in such applications.

Several position sensing technologies exist. However, providing accurate sensor information with conventional technologies typically involves expensive configurations characterized by difficult manufacturing, large physical size, and poor tolerances. It may thus be desirable to have a sensor configuration that alleviates these issues. It is with respect to these and other considerations that the disclosure made herein is presented.

SUMMARY

Within examples described herein, systems and assemblies associated with a flexible printed circuit board with coils printed thereon for indicating position of a movable member are disclosed.

Within additional examples described herein, the flexible printed circuit board having the coils printed thereon is wrapped about a housing or body in which a movable member is configured to move. The coils include at least one excitation coil and one sensing coil. As the movable member moves, linearly or rotationally, relative to the flexible printed circuit board, the coils detect the position of the movable member.

The foregoing summary is illustrative only and is not intended to be in any way limiting. In addition to the illustrative aspects, implementations, and features described above, further aspects, implementations, and features will become apparent by reference to the figures and the following detailed description.

BRIEF DESCRIPTION OF THE FIGURES

The novel features believed characteristic of the illustrative examples are set forth in the appended claims. The illustrative examples, however, as well as a preferred mode of use, further objectives and descriptions thereof, will best be understood by reference to the following detailed description of an illustrative example of the present disclosure when read in conjunction with the accompanying Figures.

DETAILED DESCRIPTION

Figure 1:
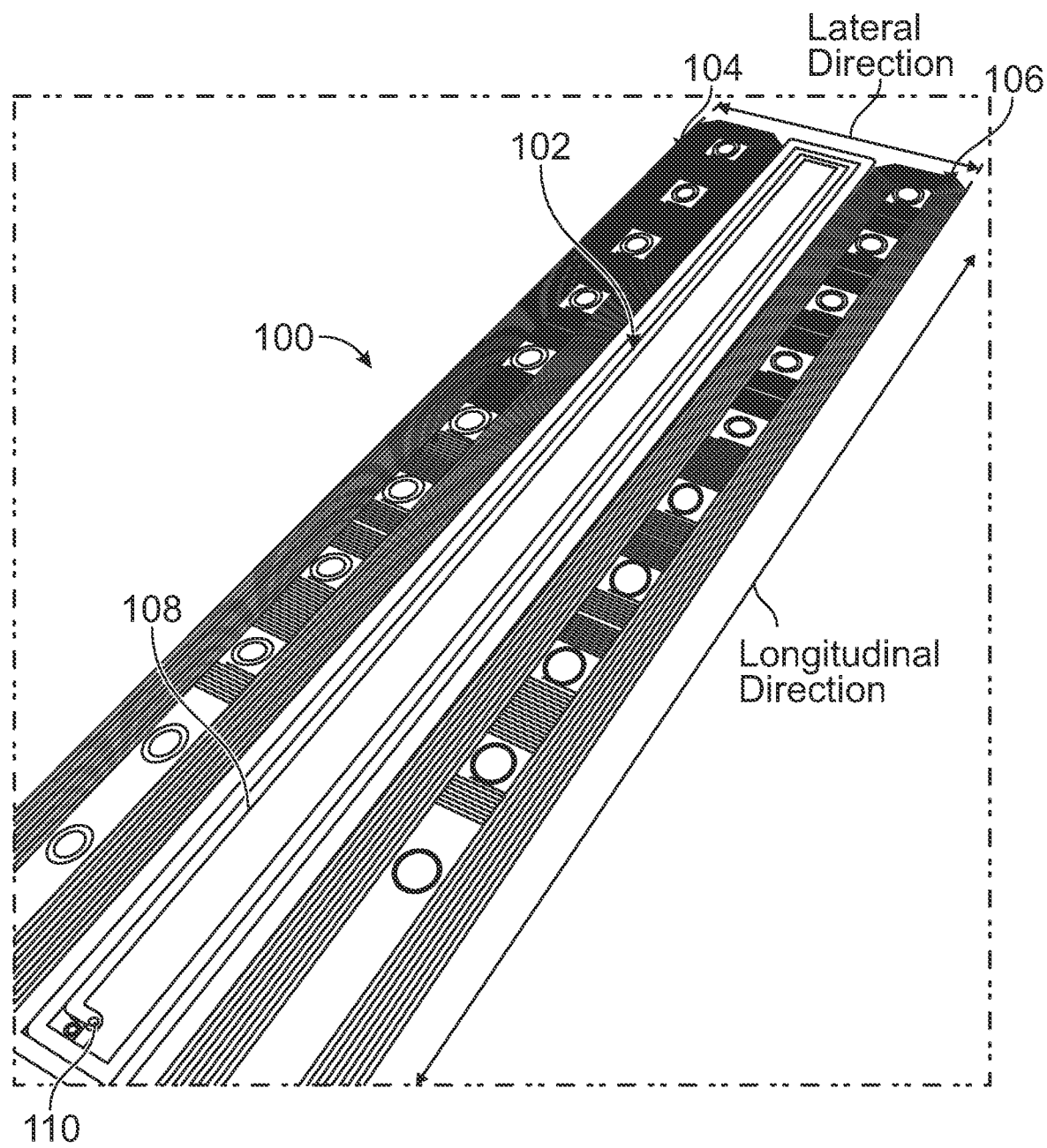
FIG. 1 illustrates a perspective view of a coil flexible printed circuit board, in accordance with an example implementation.

Devices or assemblies such as valves, actuators, electric motors, etc. have movable members such as spools, pistons, poppets, rotors, etc. Such assemblies may involve using a position sensor that provides information indicative of a position of the movable member to allow for controlling the position of the movable member, indicating fluid flow through a valve, indicate safety information, etc.

Various types of position sensors can be used to indicate position of the movable member. Example linear position sensors include linear potentiometers, linear magnetic Hall Effect sensors, magnetostrictive linear position sensor, incremental linear encoders, linear inductive position sensors, linear variable differential transformer (LVDT) sensors, draw-wire sensors, Eddy current sensors, capacitive position sensors, single point laser sensors, finger optic linear position sensors, rotary encoders, etc. Example rotary position sensors include rotational variable differential transformer (RVDT) sensors.

These conventional technologies suffer from drawbacks. For example, LVDTs and RVDTs disadvantageously require wrapping large amounts of wire to form multiple coils, rendering them expensive, complex, difficult to manufacture, and having a large physical size with poor tolerances.

Disclosed herein is a flexible printed circuit board (FPCB) that can be wrapped around a housing or body (e.g., a cylindrical member) with a cavity therein in which a movable member is configured to move, either linearly or rotationally. The FPCB has multiple coils formed as looping (e.g., as a spiral) conductive traces or tracks printed on the FPCB. The conductive tracks can be etched from one or more sheet layers of copper laminated onto and/or between sheet layers of a non-conductive substrate of the FPCB.

The multiple coils include at least one excitation coil and one sensing coil. The excitation coil generates a magnetic field that is sensed by the sensing coil, as an example. The movable member includes at least a portion that is made of a magnetic material. As the movable member moves relative to the FPCB, the magnetic field sensed by the sensing coil changes, indicating the position of the movable member.

In an example, another FPCB, e.g., a processing FPCB, may be coupled to the FPCB having the coils printed thereon. In one example, the processing FPCB is configured to have a polygonal shape with flat surfaces that mechanically supports and electrically connects electronic components (e.g., microprocessors, integrated chips (ICs), capacitors, resistors, etc.). Such components are generally soldered onto the processing FPCB to both electrically connect and mechanically fasten them to it. As such, conditioning and sensing circuits can be integrated into the processing FPCB and can be electrically coupled via conductive traces to the coils of the FPCB having the coils printed thereon.

In an example, each coil can extend in a linear manner along a length of the FPCB in the case of measuring linear movement of the movable member. In another example, the multiple, separate sensing coils can be disposed on the FPCB in the case of measuring rotational position of the movable member. The FPCB can be used in any application such as valves, actuators (hydraulic cylinders, hydraulic motors, electric actuators), electric motors, etc.

FIG. 1 illustrates a perspective view of a coil FPCB 100, in accordance with an example implementation. Printed circuit boards (PCBs) are used to minimize the size and complications that are involved in wired circuits. The wires in typical circuits are converted as conductive tracks in a PCB. Just like a wire, a conductive track also has its own resistance, and the maximum current that flows through it depends on a width of the conductive track.

PCBs can be rigid or flexible. A FPCB, which can also be referred to as a flexible printed circuit (FPC), has different properties than a rigid circuit board. Unlike a rigid PCB, a FPCB is created out of materials that can bend, giving them improved resistance to vibrations and movement and rendering them capable of fitting in tight spaces and around objects. Further, the miniaturized configuration of FPCBs allows for a substantial decrease in package weight. Another feature of an FPCB is reducing connection points, eliminating interconnection defects that are common with solder joints.

In an example, the coil FPCB 100 is configured as a bendable printed circuit that is made of a flexible film having a patterned arrangement of printed coils that use the flexible base material of the coil FPCB 100. Particularly, in the example implementation of FIG. 1, the coil FPCB 100 can have an excitation coil 102, a first sensing coil 104, and a second sensing coil 106 printed thereon. More or fewer coils can be used. For example, although one excitation coil is shown, more excitation coils could be used based on the range of motion of a movable member.

The excitation coil 102 is interposed between (or is a central coil relative to) the first sensing coil 104 and the second sensing coil 106. The excitation coil 102 is formed as a conductive track 108 that loops along the coil FPCB 100. Particularly, the conductive track 108 can have a starting point 110, the conductive track 108 then moves in a lateral direction, then in a longitudinal direction along a length of the coil FPCB 100, then in a lateral direction, then again in the longitudinal direction to form a spiral along a length of the coil FPCB 100. In the example implementation of FIG. 1, the excitation coil 102 is formed as a rectangular spiral conductive track. However, in other examples, the spiral of the excitation may have different geometric shapes, e.g., an oval shape. The term "spiral" is used herein to indicate that the conductive track winds in a continuous and gradually widening (or tightening) line or curve on a flat plane of the coil FPCB 100.

Similarly, the first sensing coil 104 is also formed as a spiral conductive track (e.g., a rectangular spiral) that is laterally-disposed from the excitation coil 102 on a first side thereof. The second sensing coil 106 is also formed as a spiral conductive track (e.g., a rectangular spiral) that is laterally-disposed from the excitation coil 102 on a second side thereof, opposite the first side on which the first sensing coil 104 is disposed. Further, as described below in more details with respect to FIG. 3, each of the coils (e.g., the excitation coil 102 and the sensing coils 104, 106) can include multiple layers of conductive tracks stacked on top of each other.

In an example, a processing FPCB may be coupled to the coil FPCB 100. The processing FPCB can have conditioning and sensing circuits that control the electric current provided to the excitation coil 102, and conditions and processes the electric current/voltage/energy induced in the sensing coils 104, 106 to provide an indication of a position of a movable member.

Figure 2:
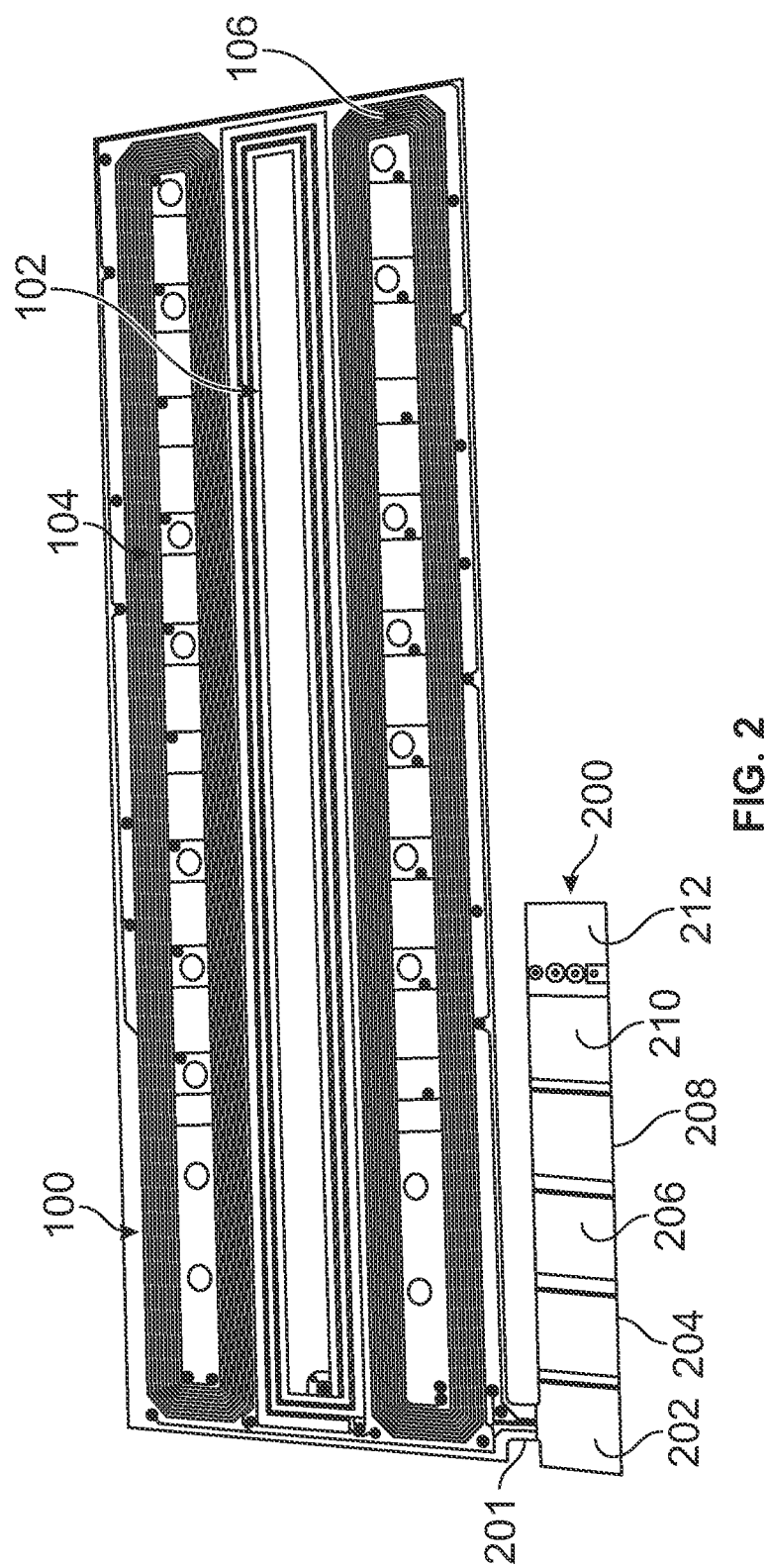
FIG. 2 illustrates a perspective view of the coil flexible printed circuit board of FIG. 1 with a processing flexible printed circuit board coupled thereto, in accordance with an example implementation.

FIG. 2 illustrates a perspective view of the coil FPCB 100 with a processing FPCB 200 coupled thereto, in accordance with an example implementation. The processing FPCB 200 is connected to the coil FPCB 100 via a bridge 201 that connects the excitation coil 102 and the sensing coils 104, 106 via conductive tracks to the electronic components of the conditioning and sensing circuitry mounted to the processing FPCB 200.

In an example, the processing FPCB 200 includes multiple segments, such that as the coil FPCB 100 is wrapped about an object, the processing FPCB 200, which is also wrapped therewith, forms a polygonal shape with flat surfaces. For example, as depicted in FIG. 2, the processing FPCB 200 includes segment 202, segment 204, segment 206, segment 208, segment 210, and segment 212. Thus, when the processing FPCB 200 is wrapped, it forms a hexagon with six flat sides that have electronic components of the conditioning and sensing circuitry (e.g., digital signal processors, microprocessors, integrated circuits, capacitors, resistors, etc.) mounted thereto.

This configuration may be advantageous in some applications. For example, cartridge valves may have hexagonally-shaped nuts or housings, around which the processing FPCB 200 can be readily wrapped due to the corresponding polygonal configuration of the processing FPCB 200. In other examples, however, the conditioning and sensing circuitry may be located externally (e.g., in a controller in communication with the coil FPCB 100) as opposed to being on a FPCB coupled to the coil FPCB 100.

Figure 3:
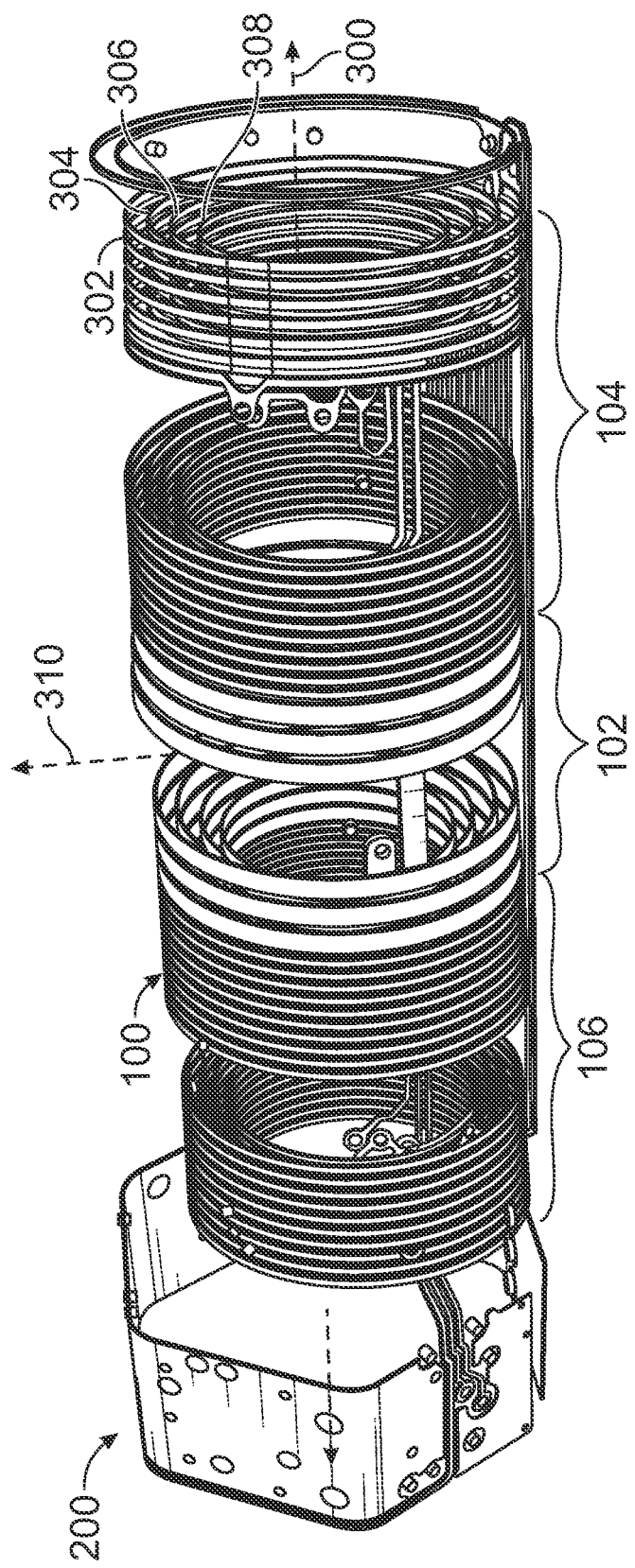
FIG. 3 illustrates a perspective view of the coil flexible printed circuit board and the processing flexible printed circuit board of FIG. 2 in a wrapped configuration about a lateral axis thereof, in accordance with an example implementation.

FIG. 3 illustrates a perspective view of the coil FPCB 100 and the processing FPCB 200 in a wrapped configuration about a lateral axis 300 thereof, in accordance with an example implementation. The substrate of the coil FPCB 100 is not shown in FIG. 3, and only the coils are shown to reduce visual clutter in the drawing. As depicted, the excitation coil 102 is centered between the pair of conductive tracks of the sensing coils, symmetrically spaced about the conductive track of the excitation coil 102.

Further, as shown in FIGS. 1-3, the conductive track of the excitation coil 102 is thicker than respective conductive tracks of the sensing coils 104, 106. As an example, the conductive track of the excitation coil 102 can have a thickness between 4 and 40 thousandth of an inch. Thicker tracks can accommodate higher electric current levels, and may keep electric resistance lower, for example. In examples, the conductive track of the excitation coil 102 can differ from the respective conductive tracks of the sensing coils 140, 106 (e.g., in thickness, width, additional turns, etc.)

As shown in FIG. 3, when the processing FPCB 200 is wrapped about the lateral axis 300, it forms a hexagon with six flat sides that facilitate mounting electronic components (e.g., ICs, capacitors, resistors, etc.) thereon. Further, each of the coils can be multiple layers deep (e.g., forms multiple layers through a depth of the coil FPCB 100). For example, the conductive track of the first sensing coil 104 forms four layers: a first layer 302, a second layer 304, a third layer 306, and a fourth layer 308. More or fewer layers could be used (e.g., six or ten layers). The conductive tracks of the excitation coil 102 and the second sensing coil 106 can also form corresponding layers as depicted in FIG. 3. This configuration may advantageously increase the inductance of the coils as discussed in more details below.

Figure 4:
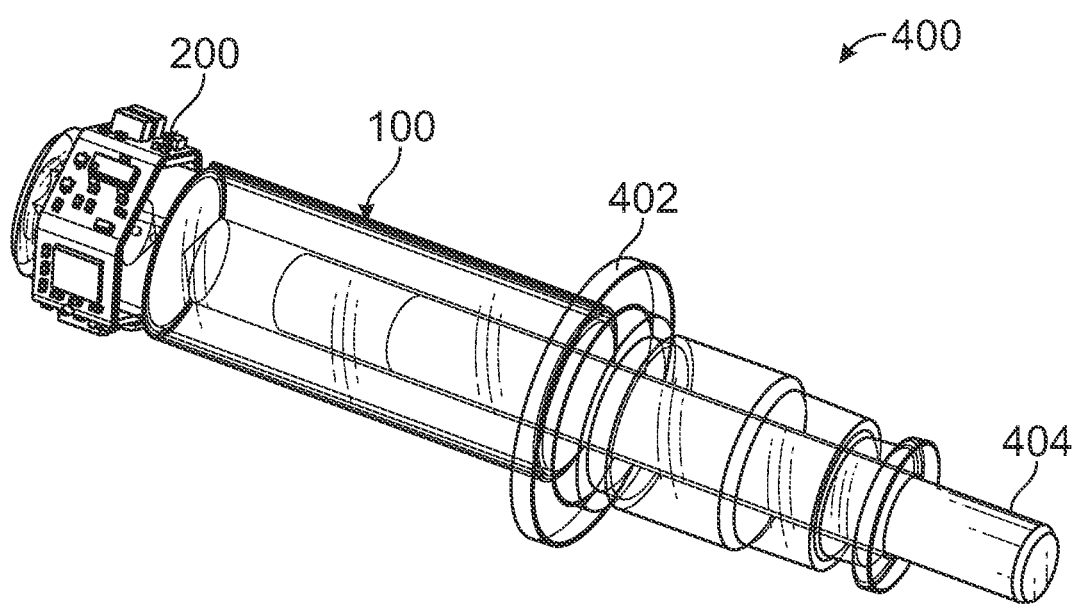
FIG. 4 illustrates an assembly of a coil flexible printed circuit board and a processing flexible printed circuit board wrapped around a cylindrical member with a movable member configured to move linearly within the cylindrical member, in accordance with an example implementation.

FIG. 4 illustrates an assembly 400 of the coil FPCB 100 and the processing FPCB 200 wrapped around a housing 402 with a movable member 404 configured to move linearly within the housing 402, in accordance with an example implementation. Details of the conductive tracks making the coils formed on the coil FPCB 100 are not shown in FIG. 4 to reduce visual clutter in the drawing.

The housing 402 is configured as any structure or body in which the movable member 404 is movable. The housing 402 is configured such that it facilitates wrapping the coil FPCB 100 and the processing FPCB 200 thereabout. For example, the housing 402 can be any vessel of a valve or actuator, and the coil FPCB 100 and the processing FPCB 200 can be disposed about an interior or exterior surface of such vessel. The housing 402 is depicted as a cylindrical member as an example for illustration. In other example implementations, the housing 402 may have other geometric shapes.

Referring to FIGS. 3-4 together, in operation, the conductive track of the excitation coil 102 can be energized by an alternating current (AC) or impulse drive of appropriate amplitude and frequency, known as the primary excitation, as examples. An impulse drive can include building up of current into the excitation coil 102 with a sudden release of current that can be repeated one or more times. Such primary excitation can be provided, for example, by the processing FPCB 200 or from an external source.

The excitation signal causes a magnetic field to be generated by the excitation coil 102, which induces a voltage in the sensing coils 104, 106. A differential signal, such as a differential voltage, differential current, differential phase, differential energy transfer between the sensing coils 104, 106 (e.g., a difference in the voltage of a signal generated in the first sensing coil 104 and the voltage of a respective signal generated in the second sensing coil 106) is sensed by the electronic components of the processing FPCB 200. In other examples, current or energy may be sensed as an alternative to voltage.

The movable member 404, or at least a portion thereof, is made of a magnetic material. Thus, as the movable member 404 moves linearly within the housing 402, the voltage induced in the sensing coils 104, 106 changes. In other words, the differential voltage between the sensing coils 104, 106, which is sensed by the processing FPCB 200, varies with the axial position of the movable member 404 within the housing 402 and the coil FPCB 100. This differential voltage is converted by suitable electronic circuitry of the processing FPCB 200 to a direct current (DC) voltage or current that is indicative of the axial position of the movable member 404. For instance, the DC voltage is usable by a controller of the assembly 400 to determine the position of the movable member 404.

The configuration of the coil FPCB 100 may provide several advantages over conventional sensing technologies. As mentioned above, the excitation coil 102 and the sensing coils 104, 106 are each formed as a conductive track that forms a spiral loop in a longitudinal direction along the length of the coil FPCB 100. The coil FPCB 100 is then wrapped about the lateral axis 300 around the housing 402 and the movable member 404. The lateral axis 300 is the direction of axial movement of the movable member 404 within the housing 402 and the coil FPCB 100.

With this configuration, the strongest magnetic field lines of the magnetic field generated by the excitation coil 102 are directed along an axis 310 (shown in FIG. 3) that is perpendicular to the lateral axis 300. This contrasts with conventional LVDT configurations which includes coils formed of wire windings that are wound around a movable member and generate a magnetic field with lines that are parallel to the direction of motion of a movable member.

Further, forming the excitation coil 102 and the sensing coils 104, 106 as printed conductive tracks allows for precise geometries and configuration of the coils. For example, conductive tracks as thin as 0.003 inches can be printed on the coil FPCB 100. This allows for more precise control of the generated magnetic fields and induced voltages.

Also, the coil FPCB 100 is thin and flexible as mentioned above and can then bend and wrap with sharp radiuses, which can be desirable in some applications, which involve tight spaces or complex shapes. Further, the coil FPCB 100 can wrap multiple times (e.g., more than one times, such as three of four times) around the movable member 404 (e.g., similar to a roll of tape wrapped multiple times about an object), which advantageously increases the inductance of the excitation coil 102 and the sensing coils 104, 106.

Particularly, a larger inductance with lower resistance of the copper conductive tracks (e.g., by making them thick) is advantageous as it lowers frequency of the induced voltage, and thus of the differential voltage output from the sensing coils 104, 106. Higher frequencies may require costly conditioning and sensing circuits in the processing FPCB 200 compared to lower frequencies. For instance, a lower frequency signal may advantageously decrease the amount of eddy currents and similar losses that can occur at higher frequencies. Additionally, by having the conductive tracks forming multiple layers as shown in FIG. 3 (e.g., the layers 302-308) the inductance of the coils is further increased, reducing the frequency of the output voltage signals further.

In examples, more sensing coils can be added in lateral directions to increase the range of detection of the movable member 404 in applications involving large strokes of the movable member 404. In other examples, functionality of the excitation coil 102 and the sensing coils 104, 106 may be reversed such that the excitation coil 102 operates as a sensing coil, whereas one or both of the sensing coils 104, 106 operate as an excitation coil. This allows for flexibility in operating the coil FPCB 100 in sensing movable members in many configurations.

In an example, a cylindrical shield made of a ferrite or other magnetic and/or electrical shielding material can be placed around the coil FPCB 100 in the wrapped state. Such shield can focus the magnetic field lines inside the coil FPCB 100 or the assembly 400 and keep external field lines and other electrical noise from interfering with the signal generated by the sensing coils 104, 106.

In an example, a temperature sensor may be integrated onto the coil FPCB 100 or the processing FPCB 200. The processing electronics of the processing FPCB 200 can then use temperature sensor information from the temperature sensor to adjust or calibrate the output signal from the sensing coils 104, 106 to compensate for temperature variations. Having such a temperature sensor integrated onto the processing FPCB 200 may reduce cost.

In one example, the processing FPCB 200 may further include a communication interface, e.g., an antenna, to communicate using various protocols such as Bluetooth, Wi-Fi, or a cellular communication protocol such as CDMA (e.g., 1×RTT or 1×EV-DO), WiMAX, LTE, IDEN, GSM, WIFI, HSPA, or any other wireless protocol), or any wired interface (e.g., serial, Controller Area Network, Ethernet, etc.). This way, the processing FPCB 200 may communicate signals indicative of a position of the movable member (e.g., the movable member 404) to a controller, a remote computing device or server, the cloud, etc. The signal indicating position can be an analog voltage signal (e.g., between zero and 5 DC voltage) or a current signal (e.g., between 4 and 20 milliampere), for example.

Alternative or in addition to using an FPCB such as the coil FPCB 100 to measure linear position of a movable member, a similar configuration can be used to measure rotational angle of a rotary object such as a rotor of an electric motor or the like. In this case, multiple smaller sensing coils can be placed laterally from the excitation coil on each side therefrom.

Figure 5:
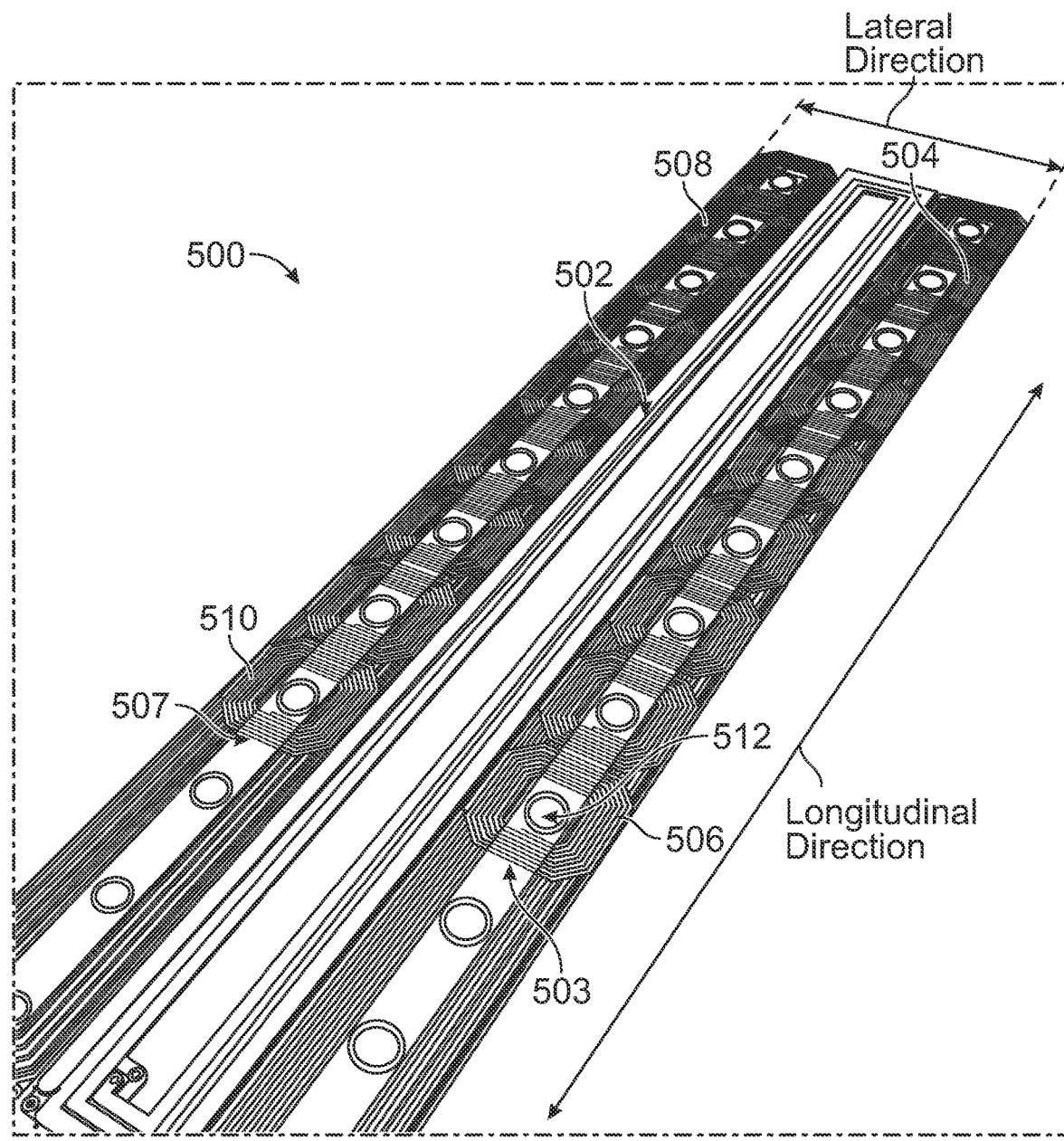
FIG. 5 illustrates a perspective view of a coil flexible printed circuit board for detecting angular position of a movable member, in accordance with an example implementation.

FIG. 5 illustrates a perspective view of a coil FPCB 500 for detecting angular position of a movable member, in accordance with an example implementation. The coil FPCB 500 is similar to the coil FPCB 100 in that they are both flexible, bendable, and capable of being wrapped about a movable (e.g., rotary) member.

As such, the coil FPCB 500 is also configured as a bendable printed circuit that is made of a flexible film having a patterned arrangement of printed coils that use the flexible base material of the coil FPCB 500. Particularly, as shown in FIG. 5, the coil FPCB 500 can have an excitation coil 502 similar to the excitation coil 102. However, rather than having a sensing coil disposed laterally on one side of the excitation coil and another sensing coil disposed laterally on the other side of the excitation coil, each side includes a plurality of smaller spiral or looping coils.

Particularly, as shown in the example implementation of FIG. 5, the coil FPCB 500 includes a first plurality of sensing coils 503, such as sensing coil 504 and sensing coil 506, disposed laterally from (e.g., on a first side of) the excitation coil 502. The coil FPCB 500 may also include a second plurality of sensing coils 507, such as sensing coil 508 and sensing coil 510, disposed laterally from (e.g., on a second side of) the excitation coil 502, opposite the first plurality of sensing coils 503. In the example implementation of FIG. 5, nine sensing coils are disposed on each side of the excitation coil 502, as an example. More or fewer excitation or sensing coils can be used depending on the application and range of rotary motion.

In an example, the coil FPCB 500 may have holes, such as hole 512, on each side of the excitation coil 502, and such holes are used to allow assembly (wrapping) to result in a stacked sensing coils directly on top of one another.

In an example, each of the sensing coils of the pluralities of sensing coils 503, 507 is formed as a spiral conductive track (e.g., rectangular spiral). Similar to the sensing coils 104, 106, the pluralities of sensing coils 503, 507 can each include multiple layers of conductive tracks stacked on top of each other (similar to the configuration shown in FIG. 3). Further, a processing FPCB similar to the processing FPCB 200 can be coupled to the coil FPCB 500.

Figure 6:
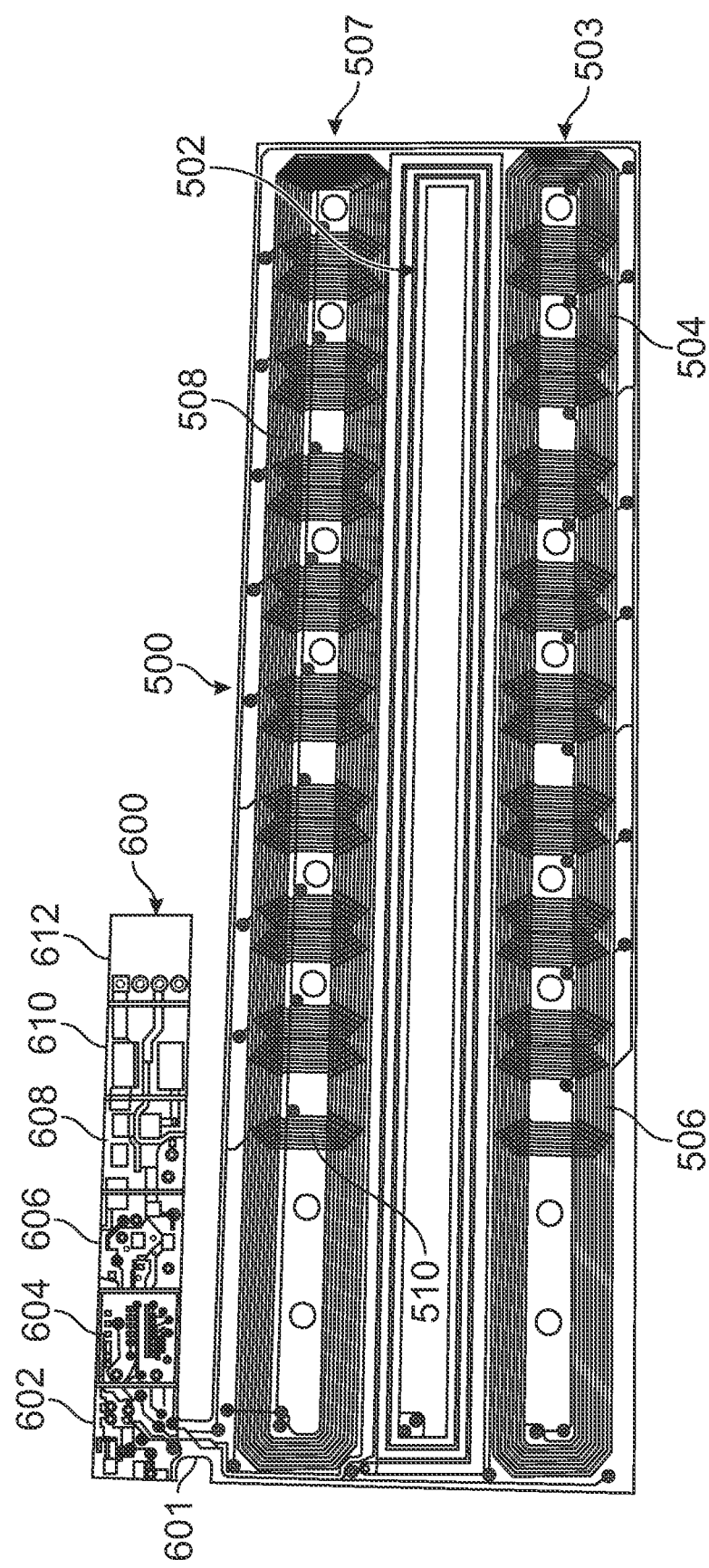
FIG. 6 illustrates a perspective view of the coil flexible printed circuit board of FIG. 5 with a processing flexible printed circuit board coupled thereto, in accordance with an example implementation.

FIG. 6 illustrates a perspective view of the coil FPCB 500 with a processing FPCB 600 coupled thereto, in accordance with an example implementation. The processing FPCB 600 is connected to the coil FPCB 500 via a bridge 601 that connects the excitation coil 502 and the pluralities of sensing coils 503, 507 via conductive tracks to the electronic components of the conditioning and sensing circuitry mounted to the processing FPCB 600.

In an example, the processing FPCB 600 includes multiple segments, such that as the coil FPCB 500 is wrapped about an object, the processing FPCB 600, which is also wrapped therewith, forms a polygonal shape with flat surfaces. For example, as depicted in FIG. 6, the processing FPCB 600 includes segment 602, segment 604, segment 606, segment 608, segment 610, and segment 612. Thus, when the processing FPCB 600 is wrapped, it forms a hexagon with six flat sides that have electronic components of the conditioning and sending circuitry (e.g., digital signal processors, microprocessors, integrated circuits, capacitors, resistors, etc.) mounted thereto. This configuration may be advantageous in some applications as mentioned above.

Figure 7:
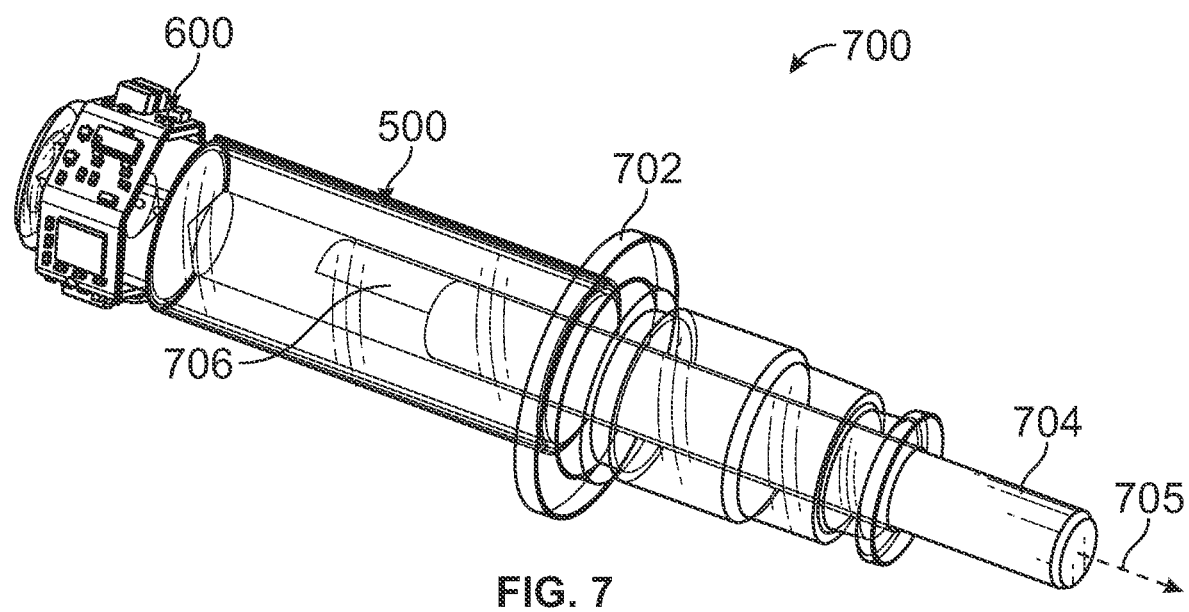
FIG. 7 illustrates an assembly of the flexible printed circuit board and the processing flexible printed circuit board of FIG. 6 wrapped around a cylindrical member with a movable member configured to move rotationally within the cylindrical member, in accordance with an example implementation.

FIG. 7 illustrates an assembly 700 of the coil FPCB 500 and the processing FPCB 600 wrapped around a housing 702 with a movable member 704 configured to move rotationally within the housing 702, in accordance with an example implementation. Details of the conductive tracks making the coils formed on the coil FPCB 500 are not shown in FIG. 7 to reduce visual clutter in the drawing.

The housing 702 is configured as any structure or body in which the movable member 704 is rotatable. The housing 702 is configured such that it facilitates wrapping the coil FPCB 500 and the processing FPCB 600 thereabout. For example, the housing 702 can be a stator of an electric motor, and the coil FPCB 500 and the processing FPCB 600 can be disposed about an interior of exterior surface thereof. The housing 702 is depicted as a cylindrical member as an example for illustration. In other example implementation, the housing 702 may have other geometric shapes.

The movable member 704 is not symmetric along an axis 705 (the longitudinal axis of the movable member 704, which coincides with the lateral axis of the coil FPCB 500). Rather, the movable member 704 has a notch 706 that is made of a magnetic material.

In operation, the conductive track of the excitation coil 502 can be energized by an AC signal or impulse drive of appropriate amplitude and frequency, known as the primary excitation, e.g., from the processing FPCB 600 or from an external source. Such excitation signal causes a magnetic field to be generated, which induces a voltage in the plurality of sensing coils 503, 507. The differential voltage between the plurality sensing coils 503, 507 is sensed by the electronic components of the processing FPCB 600. In other examples, current or energy may be sensed as an alternative to voltage.

As the movable member 704 rotates within the housing 702, the voltage induced in the pluralities of sensing coils 503, 507 changes due to the asymmetry resulting from the notch 706. In other words, the differential voltage between the pluralities of sensing coils 503, 507 sensed by the processing FPCB 600 varies with the angular position of the movable member 704 within the housing 702 and the coil FPCB 500. This differential voltage is converted by suitable electronic circuitry of the processing FPCB 600 to a DC voltage or current that is indicative of the rotary position of the movable member 704. For instance, the DC voltage is usable by a controller of the assembly 700 to determine the angular position of the movable member 704.

The configuration of the coil FPCB 500 and the processing FPCB 600 may provide the same advantages described above with respect to the coil FPCB 100 and the processing FPCB 200. Further, the configuration of the coils of the coil FPCB 500 can be combined with the configuration of coils of the coil FPCB 100 such that the combined coil FPCB can measure both linear and rotational position of movable member in applications where the movable member moves linearly and rotationally.

The assemblies 400, 700 can be used in many applications for measuring linear and/or rotary position of a movable member. A valve is described next as an example for illustration only. It should be understood that the configurations described above with respect to FIGS. 1-7 can be used with any other application where measuring a linear and/or axial position of a movable member is desirable.

Figure 8:
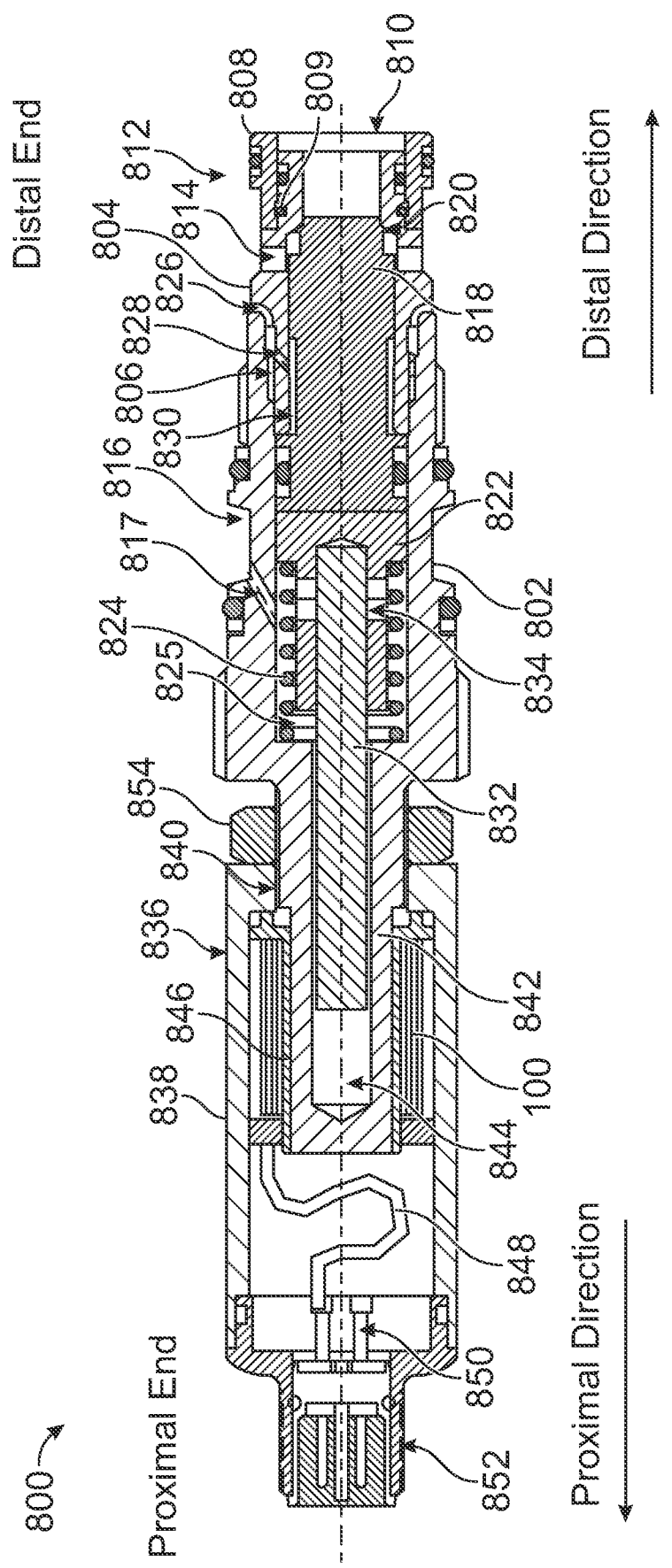
FIG. 8 illustrates a cross-sectional side view of a valve, in accordance with an example implementation.

FIG. 8 illustrates a cross-sectional side view of a valve 800, in accordance with an example implementation. The valve 800 may be inserted or screwed into a manifold having ports corresponding to ports of the valve 800 described below, and such manifold can thus fluidly couple the valve 800 to other components of a hydraulic system.

The valve 800 includes a housing 802 having a longitudinal cylindrical cavity therein. The valve 800 also includes a sleeve 804 disposed, at least partially, within the longitudinal cylindrical cavity of the housing 802 and received at a distal end of the housing 802. The sleeve 804 is rigidly- or fixedly-coupled to the housing 802. For example, the sleeve 804 can be threaded to the housing 802 via threads 806.

The valve 800 also includes a nose piece 808 received at a distal end of the sleeve 804. The nose piece 808 is coupled to the sleeve 804 via a retaining ring 809 such that the nose piece 808 is allowed to "float" relative to the sleeve 804. This way, the nose piece 808 can move to compensate for any inaccuracies in a cavity of a manifold in which the valve 800 is disposed.

The valve 800 includes a first port 810 at a nose or distal end of the nose piece 808 and the sleeve 804. The valve 800 also includes a second port 812 disposed laterally in the sleeve 804. The second port 812 can include a set of cross-holes, such as cross-hole 814, disposed in circular or circumferential array about the sleeve 804. The term "hole" is used generally herein to indicate a hollow place (e.g., cavity) in a solid body or surface, for example. The term "cross-hole" indicates a hole that crosses a path of another hole, cavity, or channel.

The valve 800 also includes a third port 816. The third port 816 can be referred to as a pilot port. The third port 816 can include one or more cross-holes that can be referred to as pilot signal cross-holes, such as a pilot signal cross-hole 817, disposed in the housing 802. As described below, the pilot signal cross-hole 817 is configured to receive a pilot fluid signal to close the valve 800 and preclude fluid flow between the first port 810 and the second port 812.

The sleeve 804 includes a respective longitudinal cylindrical cavity therein. The valve 800 includes a poppet 818 that is disposed, at least partially, and slidably-accommodated in the longitudinal cylindrical cavity of the sleeve 804. The term "slidably-accommodated" is used throughout herein to indicate that a first component (e.g., the poppet 818) is positioned relative to a second component (e.g., the sleeve 804) with sufficient clearance therebetween, enabling movement of the first component relative to the second component in the proximal and distal directions.

When the valve 800 is closed, a distal end of the poppet 818 is seated at a poppet seat 820 formed by an interior surface of the sleeve 804. The valve 800 is shown in FIG. 1 with the poppet 818 being seated at the poppet seat 820, thereby blocking a fluid path between the first port 810 and the second port 812. Further, a nose end of the poppet 818 extends distally beyond the poppet seat 820 to overlap with an interior surface of the sleeve 804 and further block fluid flow. The term "block" is used throughout herein to indicate substantially preventing fluid flow except for minimal or leakage flow of drops per minute, for example.

The valve 800 further includes a piston 822 adjacent the poppet 818. The piston 822 is slidably-accommodated within the housing 802.

The valve 800 also includes a spring 824 disposed in a spring chamber 825 within the housing 802. A proximal end of the spring 824 rests against an inner surface of the housing 802, while a distal end of the spring 824 rests against a flanged portion of the piston 822. With this configuration, the spring 824 biases the piston 822 toward the poppet 818, thereby ensuring that the poppet 818 and the piston 822 interface and move together. In an example, the spring 824 is configured as a soft spring. As an example for illustration, the spring 824 can be a twenty five pounds per square inch (psi) spring.

If fluid is provided to the first port 810, such fluid applies a fluid force in the proximal direction on the poppet 818 and the piston 822 against the spring 824. Similarly, if fluid is provided to the second port 812, such fluid flows through undercut 826 formed in the sleeve 804 and through cross-hole 828 formed in the sleeve 804 to an annular groove 830 formed in the poppet 818. The fluid in the annular groove 830 applies a fluid force in the proximal direction on the poppet 818 and the piston 822 against the spring 824.

If a pilot fluid signal is received at the third port 816, the pilot fluid signal is communicated through the pilot signal cross-hole 817 to the spring chamber 825. Such pilot fluid signal applies a fluid force on the piston 822 and the poppet 818 in the distal direction along with the biasing force on the spring 824.

As depicted in FIG. 8, the piston 822 is partially hollow and has a channel therein in which a movable member 832 is received. For example, the movable member 832 is press-fitted into the piston 822 such that the piston 822 and the movable member 832 move together. Particularly, an inner diameter of the piston 822 at a particular portion thereof can be slightly smaller than an outer diameter of the movable member 832 to allow the movable member 832 to be press-fitted within the piston 822 when pressed through the channel of the piston 822.

In an example, the piston 822 has lateral holes, such as hole 834. A tool can be inserted through the hole 834 to deform or swage the movable member 832 and ensure that the movable member 832 is coupled to the piston 822 such that as the piston 822 moves axially, the movable member 832 moves therewith. As the spring 824 forces the piston 822 against the poppet 818, the movable member 832 is indirectly coupled to the poppet 818 such that the poppet 818 and the movable member 832 move together. The movable member 832 is made, at least partially, of a magnetic material and operates as a magnetic target for a position sensor as described below.

The valve 800 further includes a position sensor assembly 836. The position sensor assembly 836 includes a sensor housing 838 that can be threaded to an exterior surface of the housing 802 via threads 840. A proximal housing portion 842 of the housing 802 extends into the sensor housing 838 and has a channel 844 that receives a portion of the movable member 832 and allows the movable member 832 to move linearly therein.

In an example, the position sensor assembly 836 may further include a sensor carrier 846, which is a hollow cylindrical component mounted about the proximal housing portion 842. The sensor carrier 846 can be made of a plastic or metallic, non-magnetic material. The coil FPCB 100 and the processing FPCB 200 are wrapped around the sensor carrier 846. In other example implementations, however, the coil FPCB 100 and the processing FPCB 200 can be mounted directly to the proximal housing portion 842.

A cable 848 connects or electrically couples the electronic circuitries of the processing FPCB 200 to conductive pins 850, which are in turn coupled to an electric connector 852. A controller (not shown) can be electrically connected to the valve 800 via a plug into the electric connector 852, thereby allowing the controller to send commands to the processing FPCB for the excitation coil 102 and also receive processed output signals generated by the processing FPCB 200.

In the example where the processing FPCB 200 is not coupled to the coil FPCB 100 and mounted inside the valve 800, components of the processing FPCB are mounted externally to the valve 800. In this example, the coil FPCB 100 receives an excitation signal via the electric connector 852, and provides output signals to an external circuit via the electric connector 852.

The position sensor assembly 836 is configured to provide sensor information indicative of a position of the movable member 832, which is also indicative of the axial position of the piston 822 and the poppet 818. As such, the movable member 832 operates as the movable member 404 described above with respect to FIG. 4. Particularly, as the movable member 832 moves axially, it disturbs the magnetic field generated by the excitation coil 102, and voltage/current induced in the sensing coils 104, 106 thus varies based on the axial position of the movable member 832. This way, the signals produced by the sensing coils 104, 106 of the coil FPCB 100 indicate a change in the magnetic field, which can be used by the processing FPCB 200 or an external controller to determine the position of the movable member 832.

In an example, the axial position of the sensor housing 838 can be adjusted relative to the housing 802 for calibration. For instance, the sensor housing 838 can be threaded in and out via the threads 840, thereby moving the coil FPCB 100 relative to the movable member 832 until a signal is detected, to indicate a predefined position of the poppet 818. The sensor housing 838 can then be locked in place via a lock nut 854.

In one example, the position sensor assembly 836 is configured as an on/off switch type sensor configured to determine whether the poppet 818 is seated at the poppet seat 820. In such position, the valve 800 blocks fluid flow from the first port 810 to the second port 812.

In another example, the position sensor assembly 836 is configured as a proportional sensor capable of determining axial position of the poppet 818 along a continuum of positions from a closed position (shown in FIG. 1) and a fully open position. In this example, the position of the movable member 832 can be indicative of a fluid flow rate between the first port 810 and the second port 812.

The valve 800 is configured to operate in two modes of operation. In a first mode of operation, no pilot fluid signal is provided to the third port 816 or the fluid force at the first port 810 or the second port 812 overcomes a combination of the pilot fluid signal force and the spring force of the spring 824. In this mode, fluid provided to the first port 810 or the second port 812 pushes the poppet 818 and the piston 822 in the proximal direction against the spring 824 to open a fluid flow path between the first port 810 and the second port 812.

Particularly, if fluid is provided to the first port 810, it pushes the poppet 818 in the proximal direction, thereby unseating the poppet 818 off the poppet seat 820 and allowing fluid to flow from the first port 810 through the cavity inside of the sleeve 804, through a flow area formed between the poppet 818 (now unseated) and the inner surface of the sleeve 804, then through the cross-hole 814 to the second port 812. Similarly, if fluid is provided to the second port 812, it pushes the poppet 818 in the proximal direction, thereby unseating the poppet 818 off the poppet seat 820 and allowing fluid to flow from the second port 812 through the cross-hole 814 of the second port 812, then through a flow area formed between the poppet 818 (now unseated) and the inner surface of the sleeve 804, then through the cavity inside of the sleeve 804 to the first port 810.

In the first mode of operation, the position sensor assembly 836 provides a signal (e.g., generated by the coil FPCB 100 and the processing FPCB 200) that indicates the position of the poppet 818. The position of the poppet 818 is also indicative of the fluid flow rate through the valve 800.

In addition to the first mode of operation, the valve 800 can operate in a second mode of operation when a pilot fluid signal is provided to the third port 816. In this mode, the fluid force of the pilot fluid signal combines with the biasing force of the spring 824 to force the piston 822 and the poppet 818 in the distal direction, thereby causing the poppet 818 to be seated at the poppet seat 820 and block fluid flow between the first port 810 and the second port 812. The position sensor assembly 836 generates a signal indicating that the poppet 818 is seated at the poppet seat 820 as a confirmation.

Figure 9:
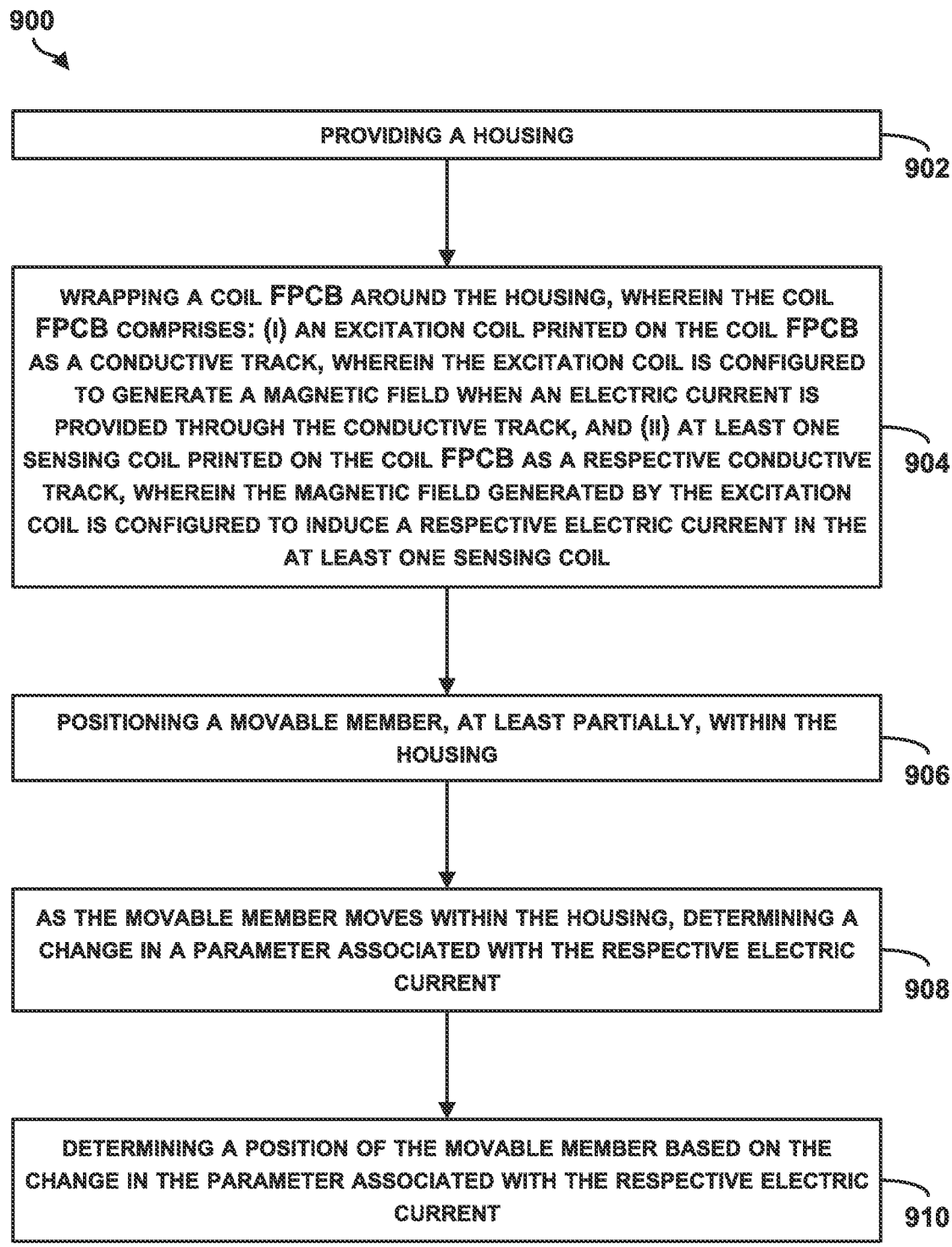
FIG. 9 is a flowchart of a method for forming and operating an assembly, in accordance with an example implementation.

FIG. 9 is a flowchart of a method 900 for forming and operating an assembly (e.g., the assembly 400 or the assembly 700), in accordance with an example implementation. The method 900 may include one or more operations, functions, or actions as illustrated by one or more of blocks 902-910.

Although the blocks are illustrated in a sequential order, these blocks may also be performed in parallel, and/or in a different order than those described herein. Also, the various blocks may be combined into fewer blocks, divided into additional blocks, and/or removed based upon the desired implementation. It should be understood that for this and other processes and methods disclosed herein, flowcharts show functionality and operation of one possible implementation of present examples. Alternative implementations are included within the scope of the examples of the present disclosure in which functions may be executed out of order from that shown or discussed, including substantially concurrent or in reverse order, depending on the functionality involved, as would be understood by those reasonably skilled in the art.

At block 902, the method 900 includes providing a housing. The term "providing" as used herein, and for example with regard to the housing 402 or the housing 702 or other components, includes any action to make the housing or any other component available for use, such as bringing the housing or other components to an apparatus or to a work environment for further processing (e.g., mounting other components, etc.).

At block 904, the method 900 includes wrapping a coil FPCB (e.g., the coil FPCB 100, 500) around the housing, wherein the coil FPCB comprises: (i) an excitation coil printed on the coil FPCB as a conductive track, wherein the excitation coil is configured to generate a magnetic field when an electric current is provided through the conductive track, and (ii) at least one sensing coil printed on the coil FPCB as a respective conductive track, wherein the magnetic field generated by the excitation coil is configured to induce a respective electric current in the at least one sensing coil.

At block 906, the method 900 includes positioning a movable member (e.g., the movable member 404, 704), at least partially, within the housing.

At block 908, the method 900 includes, as the movable member moves (e.g., linearly or rotationally) within the housing, determining a change in a parameter (voltage, current, energy etc.) associated with the respective electric current.

At block 910, the method 900 includes determining a position of the movable member based on the change in the parameter associated with the respective electric current.

The method 900 can include other steps described herein.

The detailed description above describes various features and operations of the disclosed systems with reference to the accompanying figures. The illustrative implementations described herein are not meant to be limiting. Certain aspects of the disclosed systems can be arranged and combined in a wide variety of different configurations, all of which are contemplated herein.

Further, unless context suggests otherwise, the features illustrated in each of the figures may be used in combination with one another. Thus, the figures should be generally viewed as component aspects of one or more overall implementations, with the understanding that not all illustrated features are necessary for each implementation.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

Further, devices or systems may be used or configured to perform functions presented in the figures. In some instances, components of the devices and/or systems may be configured to perform the functions such that the components are actually configured and structured (with hardware and/or software) to enable such performance. In other examples, components of the devices and/or systems may be arranged to be adapted to, capable of, or suited for performing the functions, such as when operated in a specific manner.

By the term "substantially" or "about" it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

The arrangements described herein are for purposes of example only. As such, those skilled in the art will appreciate that other arrangements and other elements (e.g., machines, interfaces, operations, orders, and groupings of operations, etc.) can be used instead, and some elements may be omitted altogether according to the desired results. Further, many of the elements that are described are functional entities that may be implemented as discrete or distributed components or in conjunction with other components, in any suitable combination and location.

While various aspects and implementations have been disclosed herein, other aspects and implementations will be apparent to those skilled in the art. The various aspects and implementations disclosed herein are for purposes of illustration and are not intended to be limiting, with the true scope being indicated by the following claims, along with the full scope of equivalents to which such claims are entitled. Also, the terminology used herein is for the purpose of describing particular implementations only, and is not intended to be limiting.

Embodiments of the present disclosure can thus relate to one of the enumerated example embodiments (EEEs) listed below.

EEE 1 is an assembly comprising: a housing; a movable member configured to move within the housing; and a coil flexible printed circuit board (FPCB) wrapped around the housing, wherein the coil FPCB comprises: a at least one excitation coil printed on the coil FPCB as a conductive track, wherein the at least one excitation coil is configured to generate a magnetic field when an electric current is provided through the conductive track, and at least one sensing coil printed on the coil FPCB as a respective conductive track, wherein the magnetic field generated by the at least one excitation coil is configured to induce a respective electric current in the at least one sensing coil, and wherein movement of the movable member within the housing changes a parameter associated with the respective electric current, thereby indicating a position of the movable member.

EEE 2 is the assembly of EEE 1, wherein the at least one excitation coil is printed on the coil FPCB as a spiral conductive track.

EEE 3 is the assembly of EEE 2, wherein the spiral conductive track is a rectangular spiral conductive track.

EEE 4 is the assembly of any of EEEs 1-3, wherein the at least one sensing coil comprises a first sensing coil that is laterally-disposed from the at least one excitation coil on a first side of the at least one excitation coil; and a second sensing coil that is laterally-disposed from the at least one excitation coil on a second side of the at least one excitation coil, opposite the first side, such that the at least one excitation coil is a central coil interposed between the first sensing coil and the second sensing coil, wherein as the movable member moves within the housing, a differential signal between the first sensing coil and the second sensing coil indicates the position of the movable member.

EEE 5 is the assembly of EEE 4, wherein the at least one excitation coil extends along a length of the coil FPCB and is wrapped around the housing therewith, wherein the first sensing coil and the second sensing coil extend along the length of the coil FPCB and are wrapped around the housing therewith, wherein the movable member is configured to move linearly within the housing, and wherein the differential signal indicates a linear position of the movable member within the housing.

EEE 6 is the assembly of any of EEEs 1-5, wherein the at least one sensing coil comprise: a first plurality of sensing coils laterally-disposed from the at least one excitation coil on a first side of the at least one excitation coil; and a second plurality of sensing coils laterally-disposed from the at least one excitation coil on a second side of the at least one excitation coil, opposite the first side, such that the at least one excitation coil is a central coil interposed between the first plurality of sensing coils and the second plurality of sensing coils, wherein each coil of the first plurality of sensing coils and of the second plurality of sensing coils is formed as a spiral conductive track, wherein the movable member is rotatable within the housing, and wherein a differential signal between coils of the first plurality of sensing coils and respective coils of the second plurality of sensing coils indicates a rotary position of the movable member within the housing.

EEE 7 is the assembly of any of EEEs 1-6, wherein the conductive track of the at least one excitation coil forms multiple layers within the coil FPCB, and wherein the respective conductive track of the at least one sensing coil forms respective multiple layers within the coil FPCB.

EEE 8 is the assembly of any of EEEs 1-7, wherein the coil FPCB is wrapped more than one time around the housing.

EEE 9 is the assembly of any of EEEs 1-8, further comprising: a processing FPCB that is coupled to the coil FPCB, wherein the processing FPCB comprises a conditioning and sensing circuitry electrically coupled to the conductive track of the at least one excitation coil and the respective conductive track of the at least one sensing coil.

EEE 10 is the assembly of EEE 9, wherein the processing FPCB comprises multiple segments, such that as the coil FPCB is wrapped around the housing, the processing FPCB is wrapped therewith, thereby forming a polygonal shape having flat sides on which electronic components of the conditioning and sensing circuitry are mounted.

EEE 11 is the assembly of any of EEEs 1-10, wherein the conductive track of the at least one excitation coil differs from the respective conductive track of the at least one sensing coil.

EEE 12 is a valve comprising: a housing; a plurality of ports comprising: a first port and a second port; a poppet that is movable relative to the housing; a spring applying a spring force on the poppet; a movable member disposed within the housing and coupled to the poppet; and a coil flexible circuit board (FPCB) wrapped around the housing, wherein the coil FPCB comprises: (i) an excitation coil printed on the coil FPCB as a conductive track, wherein the at least one excitation coil is configured to generate a magnetic field when an electric current is provided through the conductive track, and (ii) at least one sensing coil printed on the coil FPCB as a respective conductive track, wherein the magnetic field generated by the at least one excitation coil is configured to induce a respective electric current in the at least one sensing coil, wherein fluid provided to the first port pushes the poppet against the spring, thereby opening a flow path between the first port and the second port, wherein movement of the movable member with the poppet within the housing changes a parameter associated with the respective electric current, thereby indicating a position of the movable member and the poppet.

EEE 13 is the valve of EEE 12, further comprising: a sensor carrier mounted to the housing, wherein the coil FPCB is wrapped around the sensor carrier.

EEE 14 is the valve of any of EEEs 12-13, further comprising: a sensor housing threadedly engaged with the housing of the valve, such that an axial position of the sensor housing is adjustable relative to the housing, wherein adjusting the axial position of the sensor housing moves the coil FPCB relative to the movable member for calibration.

EEE 15 is the valve of any of EEEs 12-14, wherein the at least one excitation coil is printed on the coil FPCB as a rectangular spiral conductive track.

EEE 16 is the valve of any of EEEs 12-15, wherein the at least one sensing coil comprises: a first sensing coil that is laterally-disposed from the at least one excitation coil on a first side of the at least one excitation coil; and a second sensing coil that is laterally-disposed from the at least one excitation coil on a second side of the at least one excitation coil, opposite the first side, such that the at least one excitation coil is a central coil interposed between the first sensing coil and the second sensing coil, wherein as the movable member moves within the housing, a differential signal between the first sensing coil and the second sensing coil indicates the position of the movable member.

EEE 17 is the valve of EEE 16, wherein the at least one excitation coil extends along a length of the coil FPCB and is wrapped around the housing therewith, wherein the first sensing coil and the second sensing coil extend along the length of the coil FPCB and are wrapped around the housing therewith, wherein the movable member is configured to move linearly within the housing, and wherein the differential signal indicates a linear position of the movable member within the housing.

EEE 18 is the valve of any of EEEs 12-17, wherein the conductive track of the at least one excitation coil forms multiple layers within the coil FPCB, and wherein the respective conductive track of the at least one sensing coil forms respective multiple layers within the coil FPCB.

EEE 19 is the valve of any of EEEs 12-18, further comprising: a processing FPCB that is coupled to the coil FPCB, wherein the processing FPCB comprises a conditioning and sensing circuitry electrically coupled to the conductive track of the at least one excitation coil and the respective conductive track of the at least one sensing coil.

EEE 20 is the valve of EEE 19, wherein the processing FPCB comprises multiple segments, such that as the coil FPCB is wrapped around the housing, the processing FPCB is wrapped therewith, thereby forming a polygonal shape having flat sides on which electronic components of the conditioning and sensing circuitry are mounted.

What is claimed is:
1. An assembly comprising:
a housing;
a movable member configured to move within the housing; and
a coil flexible printed circuit board (FPCB) wrapped around the housing, wherein the coil FPCB comprises:
at least one excitation coil printed on the coil FPCB as a conductive track, wherein the at least one excitation coil is configured to generate a magnetic field when an electric current is provided through the conductive track, and
at least one sensing coil printed on the coil FPCB as a respective conductive track, wherein the magnetic field generated by the at least one excitation coil is configured to induce a respective electric current in the at least one sensing coil, and wherein movement of the movable member within the housing changes a parameter associated with the respective electric current in either the at least one excitation coil or the at least one sensing coil, thereby indicating a position of the movable member.

2. The assembly of claim 1, wherein the at least one excitation coil is printed on the coil FPCB as a spiral conductive track.

3. The assembly of claim 2, wherein the spiral conductive track is a rectangular spiral conductive track.

4. The assembly of claim 1, wherein the at least one sensing coil comprises:
a first sensing coil that is laterally-disposed from the at least one excitation coil on a first side of the at least one excitation coil; and
a second sensing coil that is laterally-disposed from the at least one excitation coil on a second side of the at least one excitation coil, opposite the first side, such that the at least one excitation coil is a central coil interposed between the first sensing coil and the second sensing coil, wherein as the movable member moves within the housing, a differential signal between the first sensing coil and the second sensing coil indicates the position of the movable member.

5. The assembly of claim 4, wherein the at least one excitation coil extends along a length of the coil FPCB and is wrapped around the housing therewith, wherein the first sensing coil and the second sensing coil extend along the length of the coil FPCB and are wrapped around the housing therewith, wherein the movable member is configured to move linearly within the housing, and wherein the differential signal indicates a linear position of the movable member within the housing.

6. The assembly of claim 1, wherein the at least one sensing coil comprise:
a first plurality of sensing coils laterally-disposed from the at least one excitation coil on a first side of the at least one excitation coil; and
a second plurality of sensing coils laterally-disposed from the at least one excitation coil on a second side of the at least one excitation coil, opposite the first side, such that the at least one excitation coil is a central coil interposed between the first plurality of sensing coils and the second plurality of sensing coils, wherein each coil of the first plurality of sensing coils and of the second plurality of sensing coils is formed as a spiral conductive track, wherein the movable member is rotatable within the housing, and wherein a differential signal between coils of the first plurality of sensing coils and respective coils of the second plurality of sensing coils indicates a rotary position of the movable member within the housing.

7. The assembly of claim 1, wherein the conductive track of the at least one excitation coil forms multiple layers within the coil FPCB, and wherein the respective conductive track of the at least one sensing coil forms respective multiple layers within the coil FPCB.

8. The assembly of claim 1, wherein the coil FPCB is wrapped more than one time around the housing.

9. The assembly of claim 1, further comprising:
a processing FPCB that is coupled to the coil FPCB, wherein the processing FPCB comprises a conditioning and sensing circuitry electrically coupled to the conductive track of the at least one excitation coil and the respective conductive track of the at least one sensing coil.

10. The assembly of claim 9, wherein the processing FPCB comprises multiple segments, such that as the coil FPCB is wrapped around the housing, the processing FPCB is wrapped therewith, thereby forming a polygonal shape having flat sides on which electronic components of the conditioning and sensing circuitry are mounted.

11. The assembly of claim 1, wherein the conductive track of the at least one excitation coil differs from the respective conductive track of the at least one sensing coil.

12. A valve comprising:
a housing;
a plurality of ports comprising: a first port and a second port;
a poppet that is movable relative to the housing;
a spring applying a spring force on the poppet;
a movable member disposed within the housing and coupled to the poppet; and
a coil flexible printed circuit board (FPCB) wrapped around the housing, wherein the coil FPCB comprises: (i) at least one excitation coil printed on the coil FPCB as a conductive track, wherein the at least one excitation coil is configured to generate a magnetic field when an electric current is provided through the conductive track, and (ii) at least one sensing coil printed on the coil FPCB as a respective conductive track, wherein the magnetic field generated by the at least one excitation coil is configured to induce a respective electric current in the at least one sensing coil,
wherein fluid provided to the first port pushes the poppet against the spring, thereby opening a flow path between the first port and the second port, wherein movement of the movable member with the poppet within the housing changes a parameter associated with the respective electric current, thereby indicating a position of the movable member and the poppet.

13. The valve of claim 12, further comprising:
a sensor carrier mounted to the housing, wherein the coil FPCB is wrapped around the sensor carrier.

14. The valve of claim 12, further comprising:
a sensor housing threadedly engaged with the housing of the valve, such that an axial position of the sensor housing is adjustable relative to the housing, wherein adjusting the axial position of the sensor housing moves the coil FPCB relative to the movable member for calibration.

15. The valve of claim 12, wherein the at least one excitation coil is printed on the coil FPCB as a rectangular spiral conductive track.

16. The valve of claim 12, wherein the at least one sensing coil comprises:
a first sensing coil that is laterally-disposed from the at least one excitation coil on a first side of the at least one excitation coil; and
a second sensing coil that is laterally-disposed from the at least one excitation coil on a second side of the at least one excitation coil, opposite the first side, such that the at least one excitation coil is a central coil interposed between the first sensing coil and the second sensing coil, wherein as the movable member moves within the housing, a differential signal between the first sensing coil and the second sensing coil indicates the position of the movable member.

17. The valve of claim 16, wherein the at least one excitation coil extends along a length of the coil FPCB and is wrapped around the housing therewith, wherein the first sensing coil and the second sensing coil extend along the length of the coil FPCB and are wrapped around the housing therewith, wherein the movable member is configured to move linearly within the housing, and wherein the differential signal indicates a linear position of the movable member within the housing.

18. The valve of claim 12, wherein the conductive track of the at least one excitation coil forms multiple layers within the coil FPCB, and wherein the respective conductive track of the at least one sensing coil forms respective multiple layers within the coil FPCB.

19. The valve of claim 12, further comprising:
   a processing FPCB that is coupled to the coil FPCB, wherein the processing FPCB comprises a conditioning and sensing circuitry electrically coupled to the conductive track of the at least one excitation coil and the respective conductive track of the at least one sensing coil.

20. The valve of claim 19, wherein the processing FPCB comprises multiple segments, such that as the coil FPCB is wrapped around the housing, the processing FPCB is wrapped therewith, thereby forming a polygonal shape having flat sides on which electronic components of the conditioning and sensing circuitry are mounted.

\* \* \* \* \*